(12) United States Patent
Kim et al.

(10) Patent No.: US 11,955,987 B2
(45) Date of Patent: Apr. 9, 2024

(54) NEURAL SELF-CORRECTED MIN-SUM DECODER AND AN ELECTRONIC DEVICE COMPRISING THE DECODER

(71) Applicant: Samsung Electronics Co., Ltd., Suwon-si (KR)

(72) Inventors: Taehyun Kim, Suwon-si (KR); Joosung Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/872,692

(22) Filed: Jul. 25, 2022

(65) Prior Publication Data

US 2022/0385305 A1   Dec. 1, 2022

Related U.S. Application Data

(63) Continuation of application No. PCT/KR2022/006018, filed on Apr. 27, 2022.

(30) Foreign Application Priority Data

May 25, 2021 (KR) .................. 10-2021-0066935

(51) Int. Cl.
*H03M 13/11* (2006.01)
*G06N 3/04* (2023.01)
(Continued)

(52) U.S. Cl.
CPC .......... *H03M 13/1111* (2013.01); *G06N 3/04* (2013.01); *G06N 3/082* (2013.01);
(Continued)

(58) Field of Classification Search
CPC ............ H03M 13/1128; H03M 13/09; H03M 13/1177; H03M 13/6597; H03M 13/658;
(Continued)

(56) References Cited

U.S. PATENT DOCUMENTS

| | | | |
|---|---|---|---|
| 7,693,710 B2 | 4/2010 | Jelinek et al. | |
| 10,263,640 B2 | 4/2019 | Djurdjevic et al. | |

(Continued)

FOREIGN PATENT DOCUMENTS

| | | | |
|---|---|---|---|
| CN | 107370490 A | 11/2017 | |
| CN | 108768409 A | 11/2018 | |

(Continued)

OTHER PUBLICATIONS

Ilić, V., Tadić, J. Active learning using a self-correcting neural network (ALSCN). Appl Intell 52, 1956-1968 (2022). https://doi.org/10.1007/s10489-021-02515-y.*

(Continued)

*Primary Examiner* — Steve N Nguyen
(74) *Attorney, Agent, or Firm* — Jefferson IP Law, LLP

(57) ABSTRACT

An electronic device and an operating method of an electronic device are provided. The operating method includes configuring a self-correction condition for adjusting an information deletion and dropout rate, performing iterative decoding on the received information using decoding factors and a self-correction technique, determining whether decoding of the codeword succeeds or fails, based on a result of the decoding, storing a received signal and the codeword which are successfully decoded, based on a determination result, and optimizing the decoding factors, based on the stored received signal and codeword.

12 Claims, 17 Drawing Sheets

(51) Int. Cl.
*G06N 3/082* (2023.01)
*H03M 13/09* (2006.01)

(52) U.S. Cl.
CPC ....... *H03M 13/09* (2013.01); *H03M 13/1128* (2013.01); *H03M 13/1177* (2013.01)

(58) Field of Classification Search
CPC ......... H03M 13/6583; H03M 13/1102; H03M 13/1105; H03M 13/1108; H03M 13/1111; G06N 3/04; G06N 3/09; G06N 3/082; G06N 3/02
See application file for complete search history.

(56) References Cited

U.S. PATENT DOCUMENTS

| | | | |
|---|---|---|---|
| 10,491,243 | B2 | 11/2019 | Kumar et al. |
| 10,574,390 | B2 | 2/2020 | Vojcic et al. |
| 10,693,496 | B2 | 6/2020 | Kumar et al. |
| 10,693,502 | B2 | 6/2020 | Murakami |
| 10,727,868 | B2 | 7/2020 | Abotabl et al. |
| 10,796,223 | B2* | 10/2020 | Yamazaki ................ G06N 3/08 |
| 10,892,778 | B2 | 1/2021 | Xu |
| 11,206,042 | B2 | 12/2021 | Noh et al. |
| 11,290,127 | B2 | 3/2022 | Abotabl et al. |
| 2004/0123229 | A1* | 6/2004 | Kim ...................... H04L 1/1819 714/800 |
| 2011/0154150 | A1* | 6/2011 | Kang ................ H03M 13/3707 714/752 |
| 2014/0281128 | A1* | 9/2014 | Krishnan .......... H03M 13/6325 711/103 |
| 2015/0085571 | A1* | 3/2015 | Hu ...................... G11C 11/5642 365/185.21 |
| 2017/0300380 | A1 | 10/2017 | Lei et al. |
| 2018/0343017 | A1* | 11/2018 | Kumar ............... H03M 13/1111 |
| 2018/0357530 | A1* | 12/2018 | Beery .................. H04L 1/0045 |
| 2019/0068220 | A1* | 2/2019 | Kumar ............... H03M 13/1108 |
| 2020/0134443 | A1* | 4/2020 | Qin ......................... G06N 3/10 |
| 2020/0210816 | A1* | 7/2020 | Luo ........................ G06N 3/047 |
| 2021/0050867 | A1 | 2/2021 | Han |
| 2021/0110241 | A1* | 4/2021 | Tullberg ................ G06N 3/047 |
| 2021/0142158 | A1* | 5/2021 | Agrawal ................ G06N 3/044 |
| 2021/0165712 | A1* | 6/2021 | Mitra ................. H03M 13/1108 |
| 2021/0383887 | A1* | 12/2021 | Berman .................. G11C 11/54 |
| 2022/0094468 | A1* | 3/2022 | Hong .................... H04W 88/08 |

FOREIGN PATENT DOCUMENTS

| | | |
|---|---|---|
| JP | 2018-182735 A | 11/2018 |
| KR | 10-2005-0005517 A | 1/2005 |
| KR | 10-2014-0055015 A | 5/2014 |
| KR | 10-2020-0067704 A | 6/2020 |
| KR | 10-2021-0019848 A | 2/2021 |
| KR | 10-2229233 B2 | 3/2021 |
| WO | 2018/164297 A1 | 9/2018 |

OTHER PUBLICATIONS

X. Liu, S. Li, M. Kan, S. Shan and X. Chen, "Self-Error-Correcting Convolutional Neural Network for Learning with Noisy Labels," 2017 12th IEEE International Conference on Automatic Face & Gesture Recognition (FG 2017), Washington, DC, USA, 2017, pp. 111-117.*
D. Zhang et al., "Neural Layered Min-Sum Decoding for Protograph LDPC Codes," ICASSP 2021—2021 IEEE International Conference on Acoustics, Speech and Signal Processing (ICASSP), Toronto, ON, Canada, 2021, pp. 4845-4849.*
A. R. Karami, M. Ahmadian Attari and H. Tavakoli, "Multi Layer Perceptron Neural Networks Decoder for LDPC Codes," 2009 5th International Conference on Wireless Communications, Networking and Mobile Computing, Beijing, China, 2009, pp. 1-4.*
Q. Wang, S. Wang, H. Fang, L. Chen, L. Chen and Y. Guo, "A Model-Driven Deep Learning Method for Normalized Min-Sum LDPC Decoding," 2020 IEEE International Conference on Communications Workshops (ICC Workshops), Dublin, Ireland, 2020, pp. 1-6.*
A. Payani and F. Fekri, "Decoding LDPC Codes on Binary Erasure Channels using Deep Recurrent Neural-Logic Layers," 2018 IEEE 10th International Symposium on Turbo Codes & Iterative Information Processing (ISTC), Hong Kong, China, 2018, pp. 1-5.*
W. J. Gross, V. C. Gaudet and A. Milner, "Stochastic Implementation of LDPC Decoders," Conference Record of the Thirty-Ninth Asilomar Conference onSignals, Systems and Computers, 2005., Pacific Grove, CA, USA, 2005, pp. 713-717.*
International Search Report and Written Opinion for International App. No. PCT/KR2022/006018 dated Jul. 8, 2022.

* cited by examiner

NEURAL SELF-CORRECTED MIN-SUM DECODER AND AN ELECTRONIC DEVICE COMPRISING THE DECODER

CROSS-REFERENCE TO RELATED APPLICATION(S)

This application is a continuation application, claiming priority under § 365(c), of an International application No. PCT/KR2022/006018, filed on Apr. 27, 2022, which is based on and claims the benefit of a Korean patent application number 10-2021-0066935, filed on May 25, 2021, in the Korean Intellectual Property Office, the disclosure of which is incorporated by reference herein in its entirety.

TECHNICAL FIELD

The disclosure relates to an electronic device and an operating method of an electronic device. More particularly, the disclosure relates to a neural self-corrected min-sum decoder and an electronic device including the same.

BACKGROUND ART

A low-density parity-check (LDPC) code has been adopted as a channel coding scheme for a shared channel in a new radio (NR) standard of the 3rd Generation Partnership Project (3GPP). Sum-product decoding for LDPC codes achieves remarkable decoding performance but entails significant computational complexity. Min-sum decoding replaces performance loss with costs and replaces a complicated operation used in sum-product decoding with a low-complexity operation. Offset min-sum (OMS) decoding for LDPC codes is a method of adding additional terminology to a min-sum process to approach sum-product performance while maintaining the same complexity as the min-sum process. However, a great effort may be required to find an optimal offset for each case (e.g., a code parameter and a channel condition).

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

Aspects of the disclosure are to address at least the above-mentioned problems and/or disadvantages and to provide at least the advantages described below. Accordingly, an aspect of the disclosure is to provide a device and a method for efficiently decoding an LDPC code in a wireless communication system or a storage device.

Another aspect of the disclosure is to provide a decoding device and a decoding method having an excellent error correction capability by employing factors optimized in real time, periodically, or in advance through a neural network and performing a hysteresis-based self-correction operation.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a processor, wherein the processor may be configured to receive information about a codeword, configure a self-correction condition for adjusting an information deletion and dropout rate, perform iterative decoding on the received information using decoding factors and a self-correction technique, determine whether decoding of the codeword succeeds or fails, based on a result of the decoding, store a received signal and the codeword which are successfully decoded, based on a determination result, and optimize the decoding factors, based on the stored received signal and codeword.

In accordance with another aspect of the disclosure, an operating method of an electronic device is provided. The operating method includes receiving information about a codeword, configuring a self-correction condition for adjusting an information deletion and dropout rate, performing iterative decoding on the received information using decoding factors and a self-correction technique, determining whether decoding of the codeword succeeds or fails, based on a result of the decoding, storing a received signal and the codeword which are successfully decoded, based on a determination result, and optimizing the decoding factors, based on the stored received signal and codeword.

Advantageous Effects of Invention

An electronic device and an operating method of an electronic device according to various embodiments of the disclosure may avoid an increase in complexity of an LPDC decoder by applying a previously learned factor to a min-sum decoder, and may have excellent performance through a dropout effect through four factors and controllable information deletion (self-correction) compared to an existing technique.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
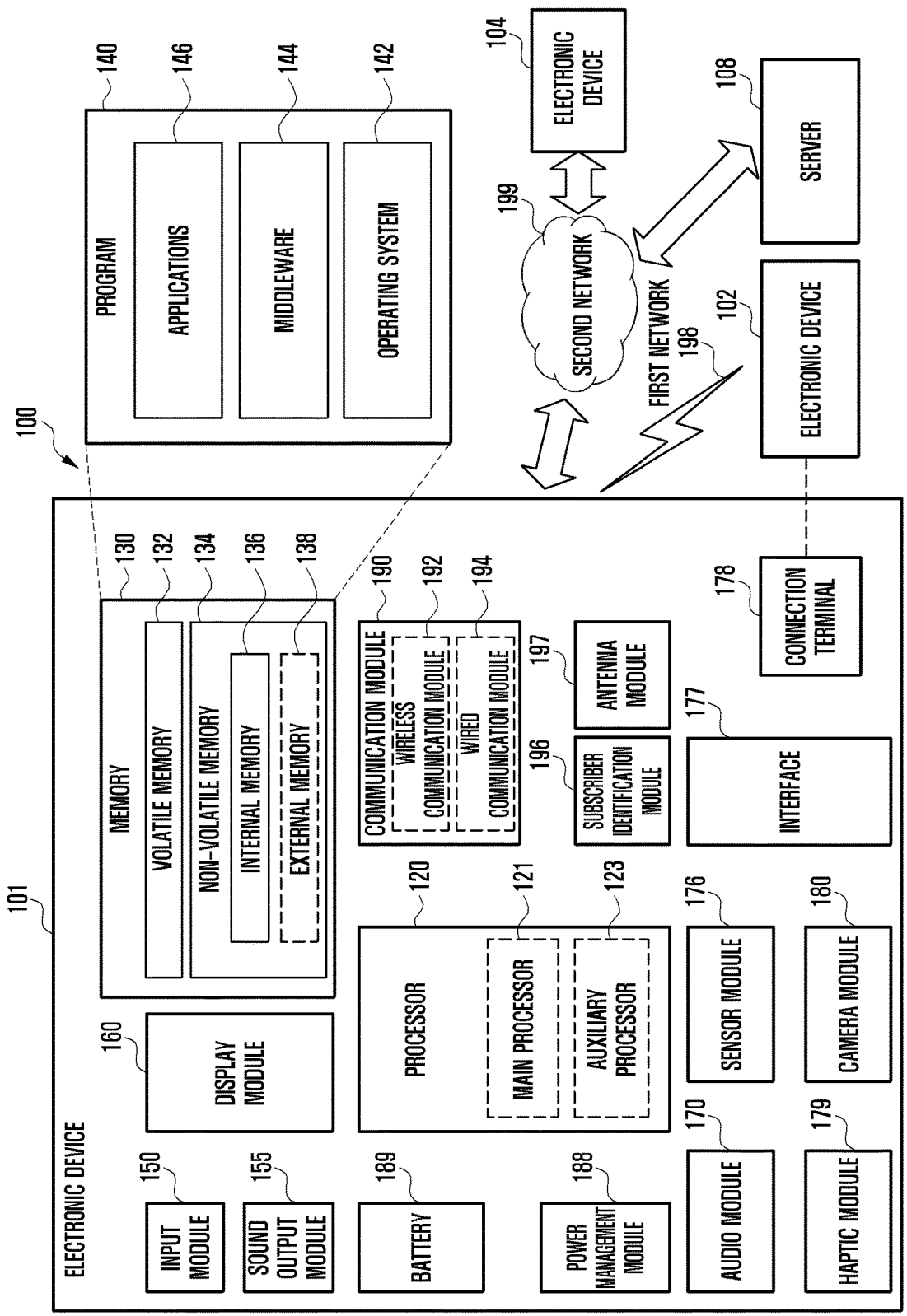
FIG. 1 is a block diagram of an electronic device according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the 11 connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). 11

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 or 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
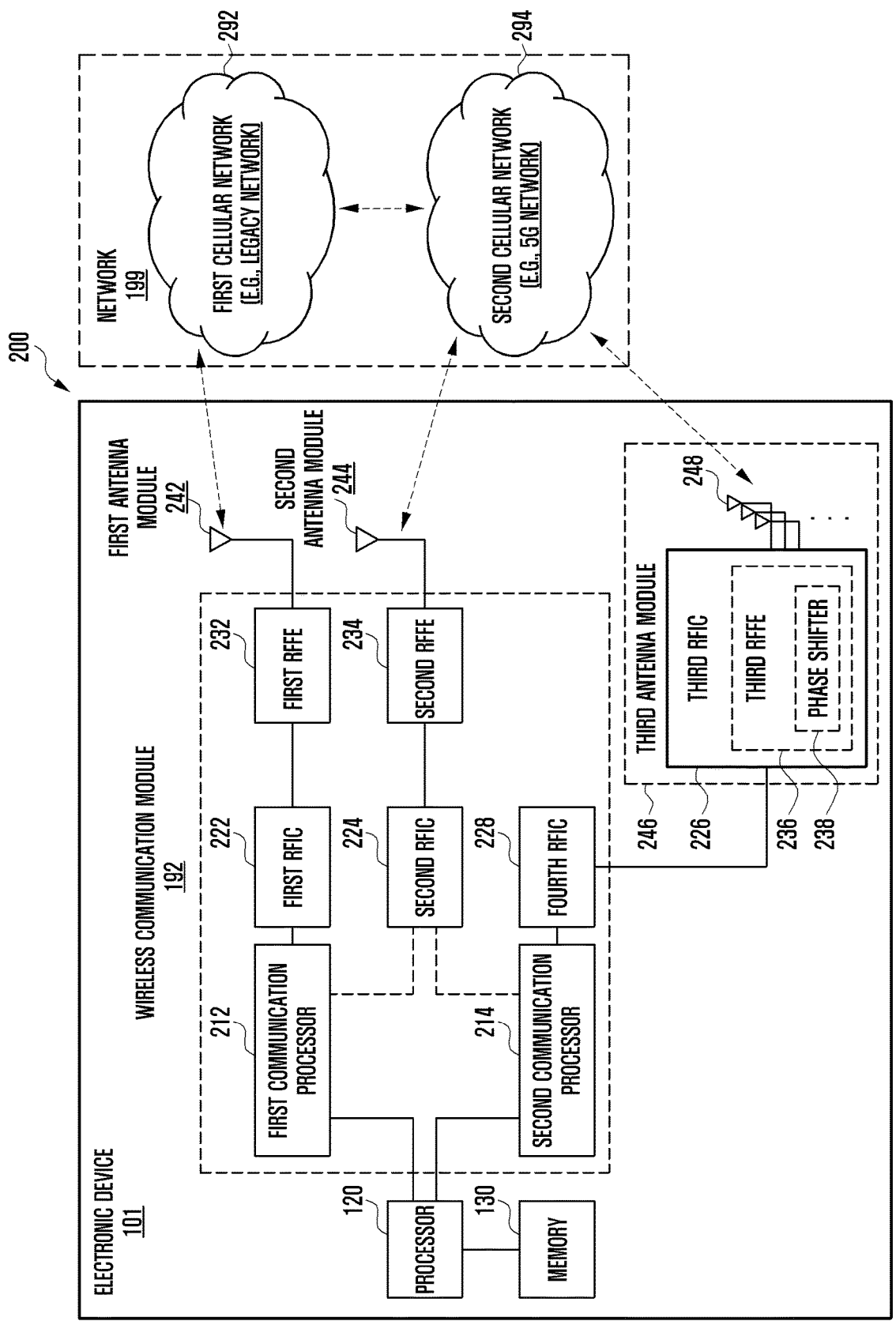
FIG. 2 is a block diagram of an electronic device for supporting legacy network communication and 5th generation (5G) network communication according to an embodiment of the disclosure.

FIG. 2 is a block diagram 200 of an electronic device 101 for supporting legacy network communication and 5G network communication according to an embodiment of the disclosure.

Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The network 199 may include a first network 292 and a second network 294. According to another embodiment, the electronic device 101 may further include at least one component among the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may be included as at least a part of the wireless communication module 192. According to another embodiment, the fourth RFIC 228 may be omitted or may be included as a part of the third RFIC 226.

The first communication processor 212 may establish a communication channel of a band to be used for wireless communication with the first network 292, and may support legacy network communication via the established communication channel. According to certain embodiments, the first network may be a legacy network including $2^{nd}$ generation (2G), $3^{rd}$ generation (3G), 4G, or long term evolution (LTE) network. The second communication processor 214 may establish a communication channel corresponding to a designated band (e.g., approximately 6 GHz to 60 GHz) among bands to be used for wireless communication with the second network 294, and may support 5G network communication via the established channel. According to certain embodiments, the second network 294 may be a 5G network defined in 3GPP. Additionally, according to an embodiment, the first communication processor 212 or the second communication processor 214 may establish a communication channel corresponding to another designated band (e.g., lower than 6 GHz) among bands to be used for wireless communication with the second network 294, and may support 5G network communication via the established channel. According to an embodiment, the first communication processor 212 and the second communication processor 214 may be implemented in a single chip or a single package. According to certain embodiments, the first communication processor 212 or the second communication processor 214 may be implemented in a single chip or a single package, together with the processor 120, the subprocessor 123, or the communication module 190.

In the case of transmission, the first RFIC 222 may convert a baseband signal generated by the first communication processor 212 into a radio frequency (RF) signal in a range of approximately 700 MHz to 3 GHz used for the first network 292 (e.g., a legacy network). In the case of reception, an RF signal is obtained from the first network 292 (e.g., a legacy network) via an antenna (e.g., the first antenna module 242), and may be preprocessed via an RFFE (e.g., the first RFFE 232). The first RFIC 222 may convert the preprocessed RF signal to a baseband signal so that the base band signal is processed by the first communication processor 212.

In the case of transmission, the second RFIC 224 may convert a baseband signal generated by the first communication processor 212 or the second communication processor 214 into an RF signal (hereinafter, a 5G Sub6 RF signal) of a Sub6 band (e.g., lower than 6 GHz) used for the second network 294 (e.g., 5G network). In the case of reception, a 5G Sub6 RF signal is obtained from the second network 294 (e.g., a 5G network) via an antenna (e.g., the second antenna module 244), and may preprocessed by an RFFE (e.g., the second RFFE 234). The second RFIC 224 may convert the preprocessed 5G Sub6 RF signal into a baseband signal so that the baseband signal is processed by a corresponding communication processor from among the first communication processor 212 or the second communication processor 214.

The third RFIC 226 may convert a baseband signal generated by the second communication processor 214 into an RF signal (hereinafter, a 5G Above6 RF signal) of a 5G Above6 band (e.g., approximately 6 GHz to 60 GHz) to be used for the second network 294 (e.g., 5G network). In the case of reception, a 5G Above6 RF signal is obtained from the second network 294 (e.g., a 5G network) via an antenna (e.g., the antenna 248), and may be preprocessed by the third RFFE 236. The third RFIC 226 may convert the preprocessed 5G Above6 RF signal to a baseband signal so that the base band signal is processed by the second communication processor 214. According to an embodiment, the third RFFE 236 may be implemented as a part of the third RFIC 226.

According to an embodiment, the electronic device 101 may include the fourth RFIC 228, separately from or as a part of the third RFIC 226. In this instance, the fourth RFIC 228 may convert a baseband signal generated by the second communication processor 214 into an RF signal (hereinafter, an IF signal) in an intermediate frequency band (e.g., approximately 9 GHz to 11 GHz), and may transfer the IF signal to the third RFIC 226. The third RFIC 226 may convert the IF signal to a 5G Above6 RF signal. In the case of reception, a 5G Above6 RF signal is received from the second network 294 (e.g., a 5G network) via an antenna (e.g., the antenna 248), and may be converted into an IF signal by the third RFIC 226. The fourth RFIC 228 may convert the IF signal to a baseband signal so that the base band signal is processed by the second communication processor 214.

According to an embodiment, the first RFIC 222 and the second RFIC 224 may be implemented as a single chip or at least a part of the single package. According to an embodiment, the first RFFE 232 and the second RFFE 234 may be implemented as a single chip or at least a part of the single package. According to an embodiment, at least one antenna module of the first antenna module 242 or the second antenna module 244 may be omitted, or may be combined with another antenna module so as to process RF signals in a plurality of bands.

According to an embodiment, the third RFIC 226 and the antenna 248 may be disposed in the same substrate, and may form the third antenna module 246. For example, the wireless communication module 192 or the processor 120 may be disposed in a first substrate (e.g., main PCB). In this instance, the third RFIC 226 is disposed in a part (e.g., a lower part) of the second substrate (e.g., a sub PCB) separate from the first substrate and the antenna 248 is disposed on another part (e.g., an upper part), so that the third antenna module 246 is formed. By disposing the third RFIC 226 and the antenna 248 in the same substrate, the length of a transmission line therebetween may be reduced. For example, this may reduce a loss (e.g., attenuation) of a signal in a high-frequency band (e.g., approximate 6 GHz to 60 GHz) used for 5G network communication, the loss being caused by a transmission line. Accordingly, the electronic device 101 may improve the quality or speed of communication with the second network 294 (e.g., 5G network).

According to an embodiment, the antenna 248 may be implemented as an antenna array including a plurality of antenna elements which may be used for beamforming. In this instance, the third RFIC 226 may be, for example, a part of the third RFFE 236, and may include a plurality of phase shifters 238 corresponding to a plurality of antenna elements. In the case of transmission, each of the plurality of phase shifters 238 may shift the phase of a 5G Above 6 RF signal to be transmitted to the outside of the electronic device 101 (e.g., a base station of a 5G network) via a corresponding antenna element. In the case of reception, each of the plurality of phase shifters 238 may shift the phase of the 5G Above 6 RF signal received from the outside via a corresponding antenna element into the same or substantially the same phase. This may enable transmission or reception via beamforming between the electronic device 101 and the outside.

The second network 294 (e.g., 5G network) may operate independently (e.g., Stand-Along (SA)) from the first network 292 (e.g., a legacy network), or may operate by being connected thereto (e.g., Non-Stand Alone (NSA)). For example, in the 5G network, only an access network (e.g., 5G radio access network (RAN) or next generation RAN (NG RAN)) may exist, and a core network (e.g., next generation core (NGC)) may not exist. In this instance, the electronic device 101 may access an access network of the 5G network, and may access an external network (e.g., the Internet) under the control of the core network (e.g., an evolved packed core (EPC)) of the legacy network. Protocol information (e.g., LTE protocol information) for communication with the legacy network or protocol information (e.g., New Radio (NR) protocol information) for communication with the 5G network may be stored in the memory 130, and may be accessed by another component (e.g., the processor 120, the first communication processor 212, or the second communication processor 214).

Figure 3:
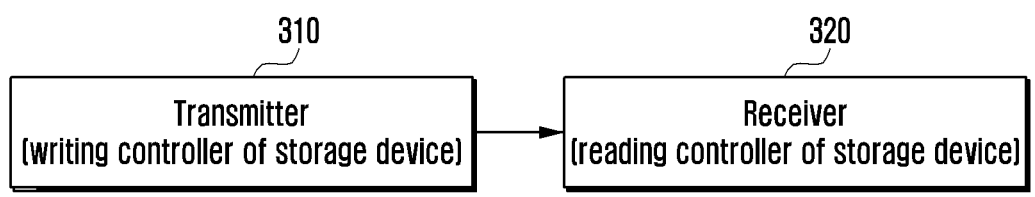
FIG. 3 is a block diagram of an electronic device according to an embodiment of the disclosure.

FIG. 3 is a block diagram of an electronic device according to an embodiment of the disclosure.

FIG. 3 shows a wireless communication system or a storage device according to an embodiment of the disclosure.

FIG. 3 illustrates a transmitter 310 and a receiver 320 as some of devices or nodes using a radio channel in a wireless communication system. Although FIG. 3 shows one transmitter 310 and one receiver 320, a plurality of transmitters 310 or a plurality of receivers 320 may be included. For example, in an uplink of a cellular communication system, the transmitter 310 may be a terminal, and the receiver 320 may be a base station. In a downlink, the transmitter 310 may be a base station, and the receiver 320 may be a terminal.

Further, FIG. 3 may be a writing controller and a reading controller in the storage device according to an embodiment of the disclosure.

In various embodiments, the transmitter 310 or the writing controller may generate a codeword by encoding information bits, based on an LDPC code, and the receiver 320 or the reading controller may decode a received codeword, based on an LDPC code.

Figure 4:
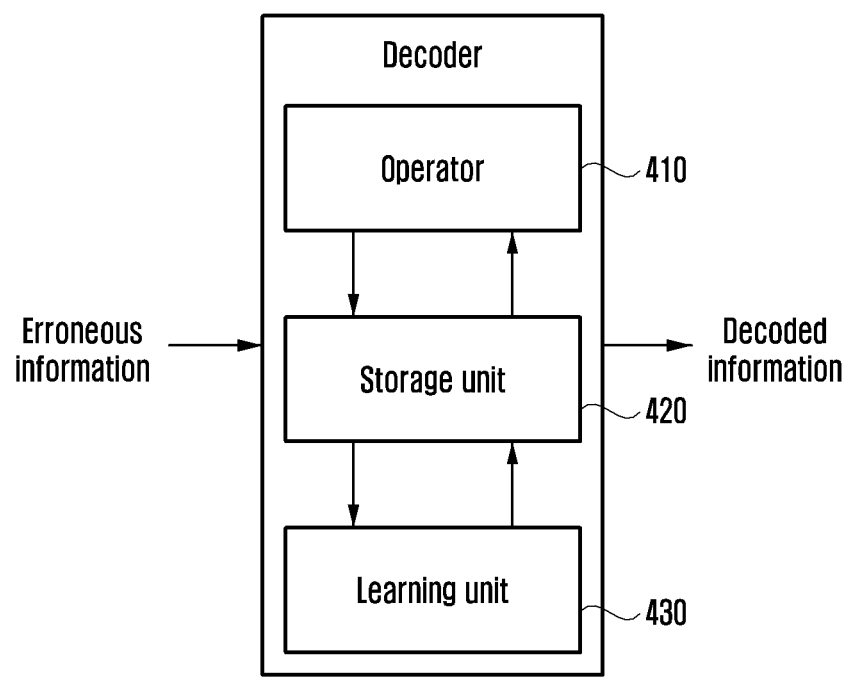
FIG. 4 is a block diagram of a decoder in an electronic device according to an embodiment of the disclosure.

FIG. 4 is a block diagram of a decoder in an electronic device according to an embodiment of the disclosure.

FIG. 4 shows a configuration of an LDPC decoding device in a receiver 320 or a reading controller according to an embodiment of the disclosure. The electronic device (e.g., the electronic device 101 of FIG. 1) of the disclosure may include an operator (including self-correction) 410, a storage unit 420, and a learning unit 430.

Referring to FIG. 4, the operator 410 and/or the learning unit 430 of the electronic device may be configured in the processor 120 of FIG. 1, and the storage unit 420 may be configured in the memory 130 of FIG. 1. Hereinafter, an operation of each component of the electronic device will be described with reference to FIG. 5.

Figure 5:
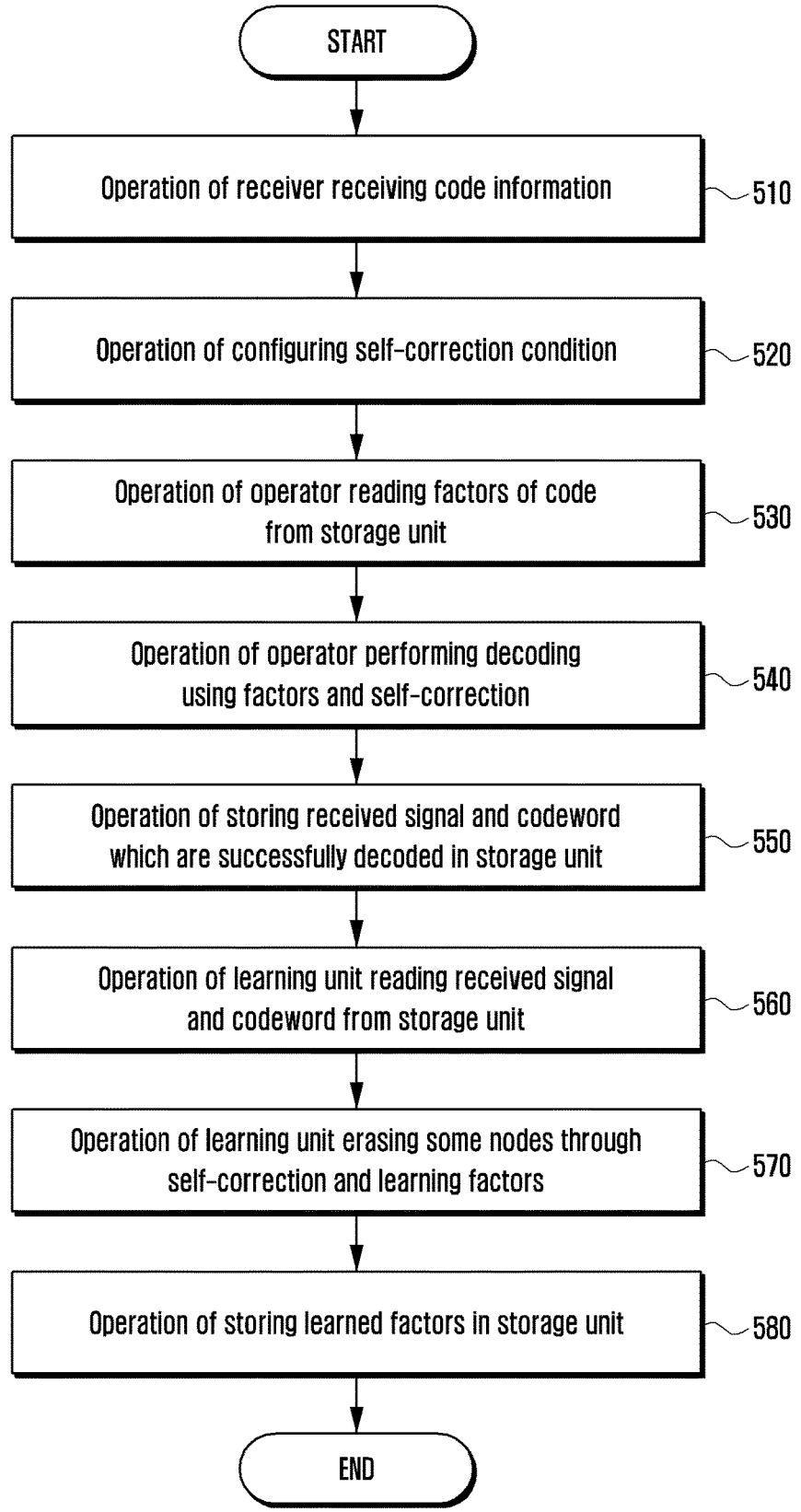
FIG. 5 illustrates an operating method of an electronic device according to an embodiment of the disclosure.

FIG. 5 illustrates an operating method of an electronic device according to an embodiment of the disclosure.

Referring to FIG. 5, the operating method of the electronic device according to various embodiments of the disclosure may include an operation of receiving information about a used LDPC code in operation 510, an operation of configuring a self-correction condition in operation 520, an operation of reading factors of the LDPC code from a storage unit in operation 530, and an operation of an operator performing decoding using the factors and self-correction in operation 540.

The operating method of the electronic device according to various embodiments of the disclosure may further include an operation of storing a received signal and a codeword which are successfully decoded in a storage unit in operation 550.

The operating method of the electronic device according to various embodiments of the disclosure may further include an operation of a learning unit reading the received signal and the codeword from the storage unit in operation 560.

The operating method of the electronic device according to various embodiments of the disclosure may further include an operation of the learning unit erasing some nodes of a neural network through self-correction and learning the factors in operation 570.

The operating method of the electronic device according to various embodiments of the disclosure may further include an operation of storing the learned factors in the storage unit in operation 580.

Operations 550 to 580 may operate only initially, may operate periodically, or may operate under a specific condition.

Figure 6:
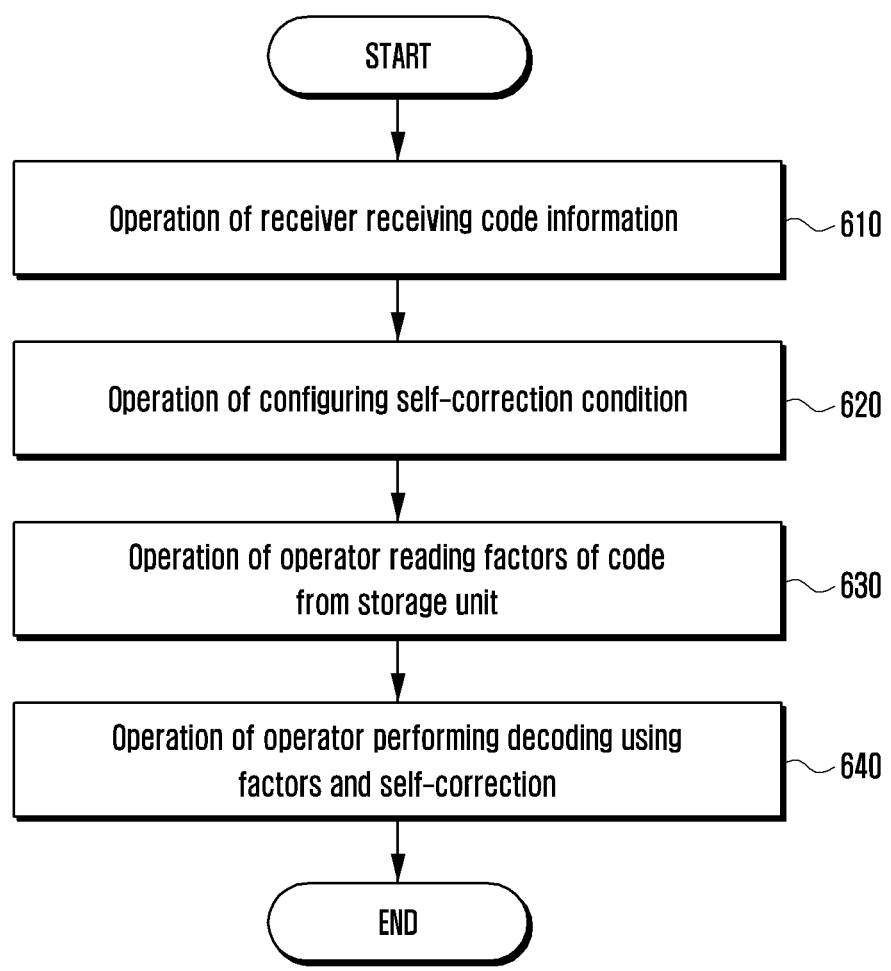
FIG. 6 illustrates an operating method of an electronic device according to an embodiment of the disclosure.

An operational flowchart of the disclosure is shown in FIGS. 5 and 6. FIG. 5 shows a case of readjusting factors using learning, and FIG. 6 shows a case of using previously learned factors.

FIG. 6 illustrates an operating method of an electronic device according to an embodiment of the disclosure.

Referring to FIG. 6, in an embodiment of using the previously learned factors, an operating method of an electronic device may include an operation of receiving information about a used LDPC code in operation 610, an operation of configuring a self-correction condition in operation 620, an operation of reading factors of the LDPC code from a storage unit in operation 630, and an operation of an operator performing decoding using the factors and self-correction in operation 640.

Figure 7:
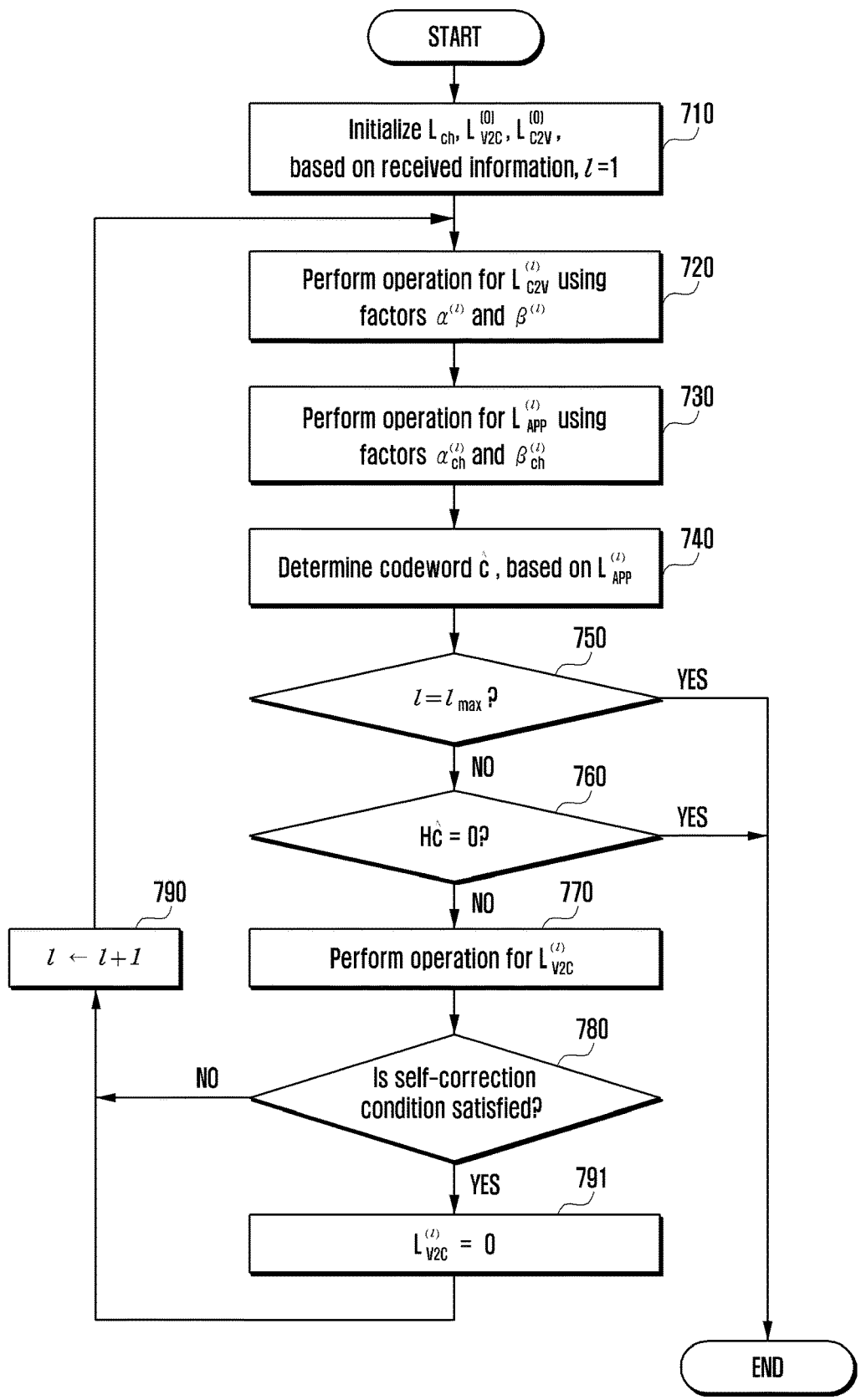
FIG. 7 illustrates an operating method of an operator of an electronic device according to an embodiment of the disclosure.

FIG. 7 illustrates an operating method of an electronic device according to an embodiment of the disclosure.

Referring to FIG. 7, the electronic device defines $L_{ch}(n)$ as a log-likelihood ratio (LLR) for an nth bit of a codeword and approximates this value as reception information about the nth bit of the codeword in Equation 1.

$$L_{ch}(n) \sim y(n) \qquad \text{Equation 1}$$

According to various embodiments of the disclosure, in operation 710, the electronic device performs an LLR initialization process for messages exchanged between variable nodes and check nodes. First, the electronic device initializes messages transmitted from all of the variable nodes to the check nodes. An initial value for a message transmitted from an nth variable node to an mth check node is $L_{Ch}(n)$ in Equation 2.

$$L_{V2C}^{(0)}(m,n) = L_{ch}(n) \qquad \text{Equation 2}$$

Initial values for messages transmitted from all of the check nodes to the variable nodes are equally 0 in Equation 3.

$$L_{C2V}^{(0)}(m,n) = 0 \qquad \text{Equation 3}$$

According to various embodiments of the disclosure, in operation 720, the electronic device performs an operation for the messages transmitted from the check nodes to the variable nodes after terminating the initialization process. In an lth iteration process, an operation for a message transmitted from the mth check node to the nth variable node is as in Equation 4.

$$L_{C2V}^{(l)}(m, n) = \prod_{n' \in N(m)\backslash n} \text{sgn}(L_{V2C}^{(l-1)}(m, n')) \cdot \qquad \text{Equation 4}$$
$$\max\left(\alpha^{(l)} \min_{n' \in N(m)\backslash n} (|L_{V2C}^{(l-1)}(m, n')|) + \beta^{(l)}, 0\right)$$

N(m) is a set of variable nodes neighboring the mth check node, and N(m)\n is a set of variable nodes other than the nth variable node in the set. $\alpha^{(l)}$ and $\beta^{(l)}$ are defined as a normalization factor and an offset factor and may have different values depending on the number of iterations.

According to various embodiments of the disclosure, after terminating all operations for the messages transmitted from the check nodes to the variable nodes, the electronic device calculates a posteriori probability LLR in operation 730 in Equation 5.

$$L_{APP}^{(l)}(n) = \qquad \text{Equation 5}$$
$$\text{sgn}(L_{ch}(n)) \cdot \max(\alpha_{ch}^{(l)}|L_{ch}(n)| + \beta_{ch}^{(l)}, 0) + \sum_{m' \in M(n)} L_{C2V}^{(l)}(m', n)$$

M(n) is a set of check nodes neighboring the nth variable node. $\alpha_{ch}^{(l)}$ and $\beta_{ch}^{(l)}$ are defined as a channel normalization factor and a channel offset factor and may have different values depending on the number of iterations.

According to various embodiments of the disclosure, in operation 740, the electronic device determines the decoded codeword, based on the posteriori probability LLR, as follows in Equation 6.

$$\hat{c}(n) = sgn(L_{APP}^{(l)}(n)) \quad \text{Equation 6}$$

According to various embodiments of the disclosure, in operation 760, the electronic device determines whether the determined codeword is proper by performing a syndrome check (Hĉ) using a parity check matrix H. The codeword being proper (Hĉ=0) means that the codeword is successfully decoded, and decoding is terminated.

According to various embodiments of the disclosure, when the codeword is not proper (Hĉ≠0), the electronic device performs an operation for the messages transmitted from the variable nodes to the check nodes in Equation 7 in operation 770.

$$L_{V2C}^{(l)}(m,n) = L_{APP}^{(l)}(n) - L_{C2V}^{(l)}(m,n) \quad \text{Equation 7}$$

According to various embodiments of the disclosure, in operation 780, the electronic device may identify whether a self-correction condition is satisfied, based on an operation result.

According to various embodiments of the disclosure, when $L_{V2C}^{(l)}(m, n)$ is determined to be unreliable information according to a previous state $(L_{V2C}^{(0)}(m, n), \ldots L_{V2C}^{(l-1)}(m, n))$, the electronic device performs hysteresis-based self-correction of deleting the information ($L_{V2C}^{(l)}(m, n)=0$) in operation 791. Illustrated below is an embodiment of a hysteresis-based operation in Equation 8.

$$L_{V2C}^{(l)}(m, n) = \begin{cases} 0, & sgn(L_{V2C}^{(l-1)}(m, n)) - \\ & sgn(L_{V2C}^{(l-1)}(m, n))\delta_{l-1})sgn(L_{V2C}^{(l)}(m, n)) - \\ & sgn(L_{V2C}^{(l)}(m, n))\delta_l < 0 \\ L_{V2C}^{(l)}(m, n), & \text{otherwise} \end{cases} \quad \text{Equation 8}$$

$\delta_l$ is a self-correction rate adjustment variable of an lth iteration, and the rate of messages deleted through self-correction in the lth iteration in operation 790 may be adjusted according to configurations of $\delta_l$ and $\delta_{l-1}$. For example, in a case where $\delta_{l-1} = \delta_l = 0$, when sgn $(L_{V2C}^{(l)}(m, n))$ and sgn $(L_{V2C}^{(l-1)}(m, n))$ are different, the information of $L_{V2C}^{(l)}(m, n)$ is deleted ($L_{V2C}^{(l)}(m, n)=0$).

For a message of which information is deleted in a previous iteration (l−1), obtained $L_{V2C}^{(l)}(m, n)$ is maintained without performing self-correction. The foregoing process is repeated by a preset number of iterations ($I_{max}$)(operation 750).

A learning unit performs an operation of optimizing a normalization factor, an offset factor, a channel normalization factor, and a channel offset factor.

Figure 8:
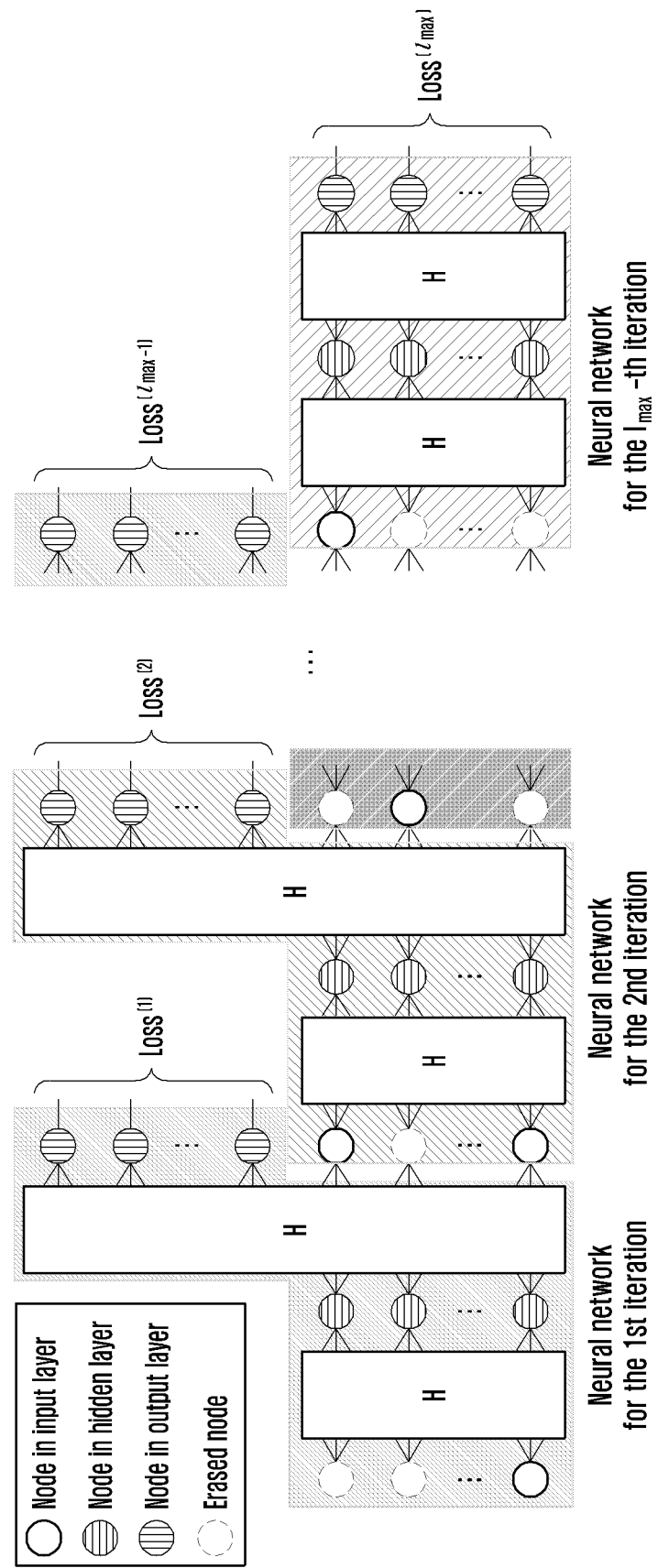
FIG. 8 illustrates a neural network structure of a learning unit of an electronic device according to an embodiment of the disclosure.

FIG. 8 illustrates a neural network structure according to an embodiment of the disclosure. $I_{max}$ shallow neural networks are sequentially connected, and each neural network optimizes factors used in each iteration. For example, a third neural network optimizes factors $\alpha^{(3)}$, $\beta^{(3)}$, $\alpha_{ch}^{(3)}$, and $\beta_{ch}^{(3)}$ of a third iteration operation of a decoder.

The optimization process of the learning unit is as follows.

Defining an input of an lth neural network as $L_{in}^{(l)}(m, n)$, an output $L_{hd}^{(l)}(n, n)$ of a hidden layer may be represented by Equation 9.

$$L_{hd}^{(l)}(m, n) = \prod_{n' \in N(m)\setminus n} sgn(L_{in}^{(l)}(m, n')) \cdot ReLU\left(w_\alpha \min_{n' \in N(m)\setminus n}(|L_{in}^{(l)}(m, n')|) + w_\beta\right) \quad \text{Equation 9}$$

An ReLU function is an activation function widely used for a hidden layer of a neural network, and is ReLU(x)=max (x, 0). $w_\alpha$ and $w_\beta$ are weights to be learned, and are respectively used as the values of factors $\alpha^{(l)}$ and $\beta^{(l)}$ when learning is completed.

A relationship between the output $L_{hd}^{(l)}(m, n)$ of the hidden layer and an output $L_{out}^{(l)}(n)$ of an output layer may be represented as follows in Equation 10.

$$L_{out}^{(l)}(n) = sgn(L_{ch}(n)) \cdot ReLU(w_{\alpha_{ch}} |L_{ch}(n)| + w_{\beta_{ch}}) + \sum_{m' \in M(n)} L_{hd}^{(l)}(m', n) \quad \text{Equation 10}$$

$w_{\alpha_{ch}}$ and $w_{\beta_{ch}}$ are weights to be learned, and are respectively used as the values of factors $\alpha_{ch}^{(l)}$ and $\beta_{ch}^{(l)}(n)$ when learning is completed.

A final output $L_{out}^{(l)}(n)$ of the output layer is input to a sigmoid function as one activation function and is converted into a value ranging between 0 and 1 in Equation 11.

$$o^{(l)}(n) = \frac{1}{1 + e^{-L_{out}^{(l)}(n)}} \quad \text{Equation 11}$$

The difference between the output of the neural network of the disclosure and a label of data is represented by the following loss function in Equation 12.

$$\text{Loss} = -\frac{1}{N}\sum_{n=1}^{N}\left(p(n)\ln(o^{(l)}(n)) + (1 - p(n))\ln(1 - o^{(l)}(n))\right) \quad \text{Equation 12}$$

p(n) is a label of learning data, and has a relationship with a transmitted codeword c(n) such that p(n)=1−c(n). Learning is a process for discovering a weight that minimizes the loss. There are various optimization methods in neural network learning, and learning is performed using an Adam method in an embodiment of the disclosure.

When learning for the lth neural network is terminated, an input of an (l+1)th neural network or a learning data set $L_{in}^{(l+1)}(n)$ are calculated using optimized factors by Equation 13.

$$L_{hd}^{(l)}(m, n) = \prod_{n' \in N(m)\setminus n} sgn(L_{in}^{(l)}(m, n')) \cdot ReLU\left(\alpha^{(l)} \min_{n' \in N(m)\setminus n}(|L_{in}^{(l)}(m, n')|) + \beta^{(l)}\right) \quad \text{Equation 13}$$

$$L_{in}^{(l+1)}(n) = sgn(L_{ch}(n)) \cdot ReLU(\alpha_{ch}^{(l)}|L_{ch}(n)| + \beta_{ch}^{(l)}) +$$

-continued $$\sum_{m' \in M(n) \backslash m} L_{hd}^{(l)}(m', n)$$

Here, a node to be erased according to the state ($L_{in}^{(1)}$(m, n), ..., $L_{in}^{(l)}$(m, n)) of an equivalent node in a previous neural network is determined by applying the hysteresis-based self-correction condition of an operator to $L_{in}^{(l+1)}$(m, n). Illustrated blow is an embodiment of a hysteresis-based node erasing operation in Equation 14.

Equation 14

$$L_{in}^{(l+1)}(m, n) = \begin{cases} 0, & \text{sgn}(L_{in}^{(l)}(m, n) - \text{sgn}(L_{in}^{(l)}(m, n))\delta_l)\text{sgn}(L_{in}^{(l+1)}(m, n) - \text{sgn}(L_{in}^{(l+1)}(m, n))\delta_{l+1}) < 0 \\ L_{in}^{(l+1)}(m, n), & \text{otherwise} \end{cases}$$

$\delta_l$ is a self-correction rate adjustment variable of the lth neural network, and the rate of nodes erased from the (l+1)th neural network through may be adjusted according to configurations of $\delta_{l+1}$ and $\delta_l$. For example, in a case where $\delta_{l+1}=\delta_1=0$, when sgn ($L_{in}^{(l+1)}$(m, n)) and sgn ($L_{in}^{(l)}$(m, n)) are different, the node of an input layer is erased ($L_{in}^{(l+1)}$(m, n)=0) in learning using corresponding learning data. A node in the (l+1)th neural network, which is at an equivalent position as that of the erased node from the input layer of the lth neural network, is not erased. Nodes associated with a puncturing position of a used LDPC code are erased from an input layer of a first neural network. In configuring a neural network, when all nodes of an input layer connected to a node of a hidden layer are erased, the node of the hidden layer is also erased.

An initial learning data set used in a series of operations of the learning unit includes a received signal y. $L_{ch}$(n) and $L_{in}$(m, n')(=$L_{V2C}^{(0)}$(m, n)) are generated with the received signal y by the same method of the operator. Optimized weights are stored as factor values of a corresponding code in a storage unit.

The learning unit may be operated only in an initial setup, may be operated whenever there is a significant change in a surrounding channel environment, or may be periodically or always operated.

When the learning unit is operated whenever there is a significant change in the surrounding channel environment or is periodically or always operated, previously optimized factors may be configured as the initial values of weights, thereby reducing time required for learning.

The storage unit stores the normalization factor, the offset factor, the channel normalization factor, and the channel offset factor. When a receiver identifies information about which code is used, an iterative decoding operation is performed by importing factor values of the code from the storage unit. In addition, a received signal and a codeword which are successfully decoded may be stored in the storage unit. The stored received signal and codeword are used as learning data in real-time optimization in the learning unit.

A device and a method according to various embodiments of the disclosure enable efficient decoding of an LDPC code.

Further, a device and a method according to various embodiments of the disclosure may readjust decoding variables to a channel change through neural network learning, thereby preventing deterioration in performance of decoding an LDPC code due to configuration of a factor value which is not suitable for a changed channel.

In addition, an information deletion operation through self-correction of the disclosure causes dropout of omitting some nodes in an input layer and a hidden layer of a neural network in a learning process. When neural network learning is performed with less learning data for real-time factor readjustment, the possibility of occurrence of overfitting increases, which induces improper optimization, thus causing performance deterioration. The disclosure reduces the possibility of occurrence of overfitting by producing a dropout effect through an information deletion operation through self-correction.

Furthermore, a dropout rate may be adjusted through adjustment of a hysteresis-based self-correction condition, thereby maximizing optimization performance.

FIGS. 9, 10A to 10D, and 11A to 11D show performance according to various embodiments of the disclosure.

Figure 9:
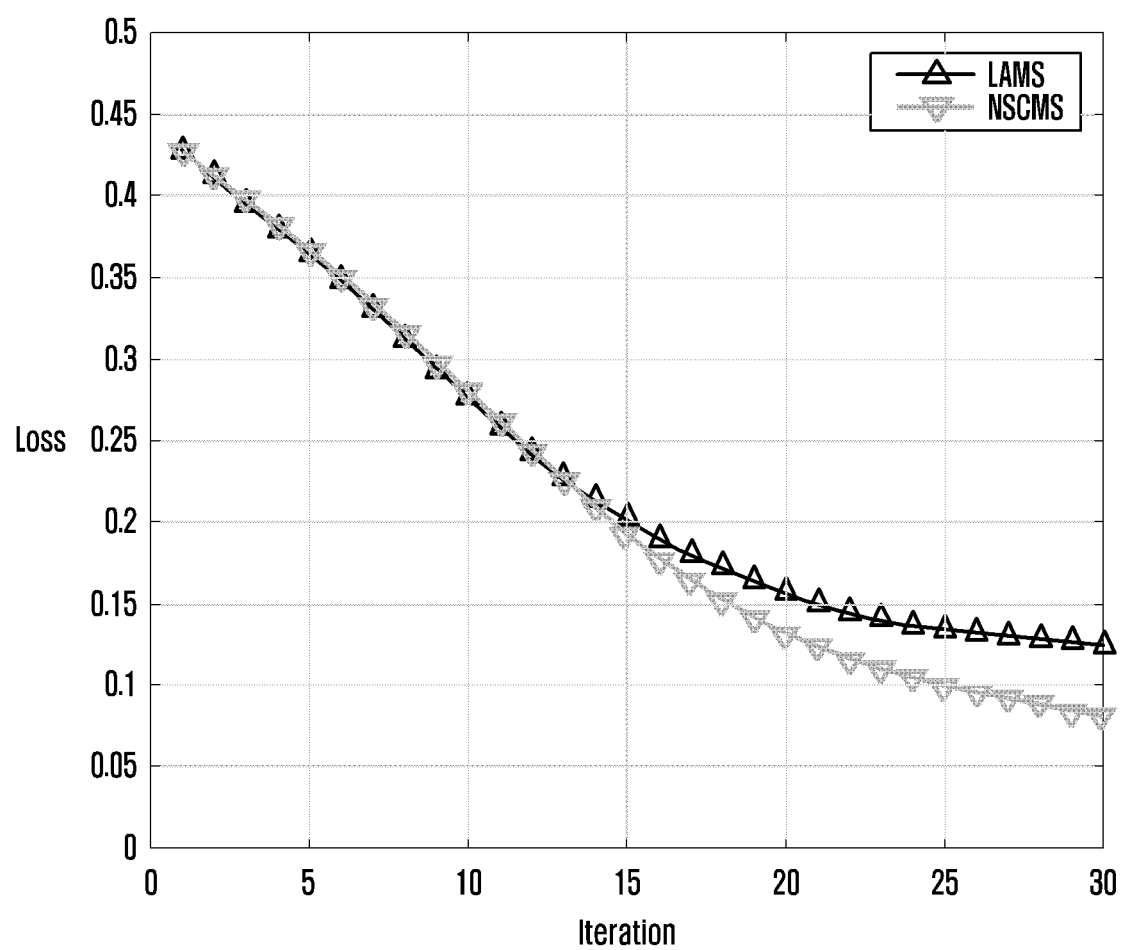
FIG. 9 illustrates an error rate of an electronic device according to an embodiment of the disclosure.
Figure 10A:
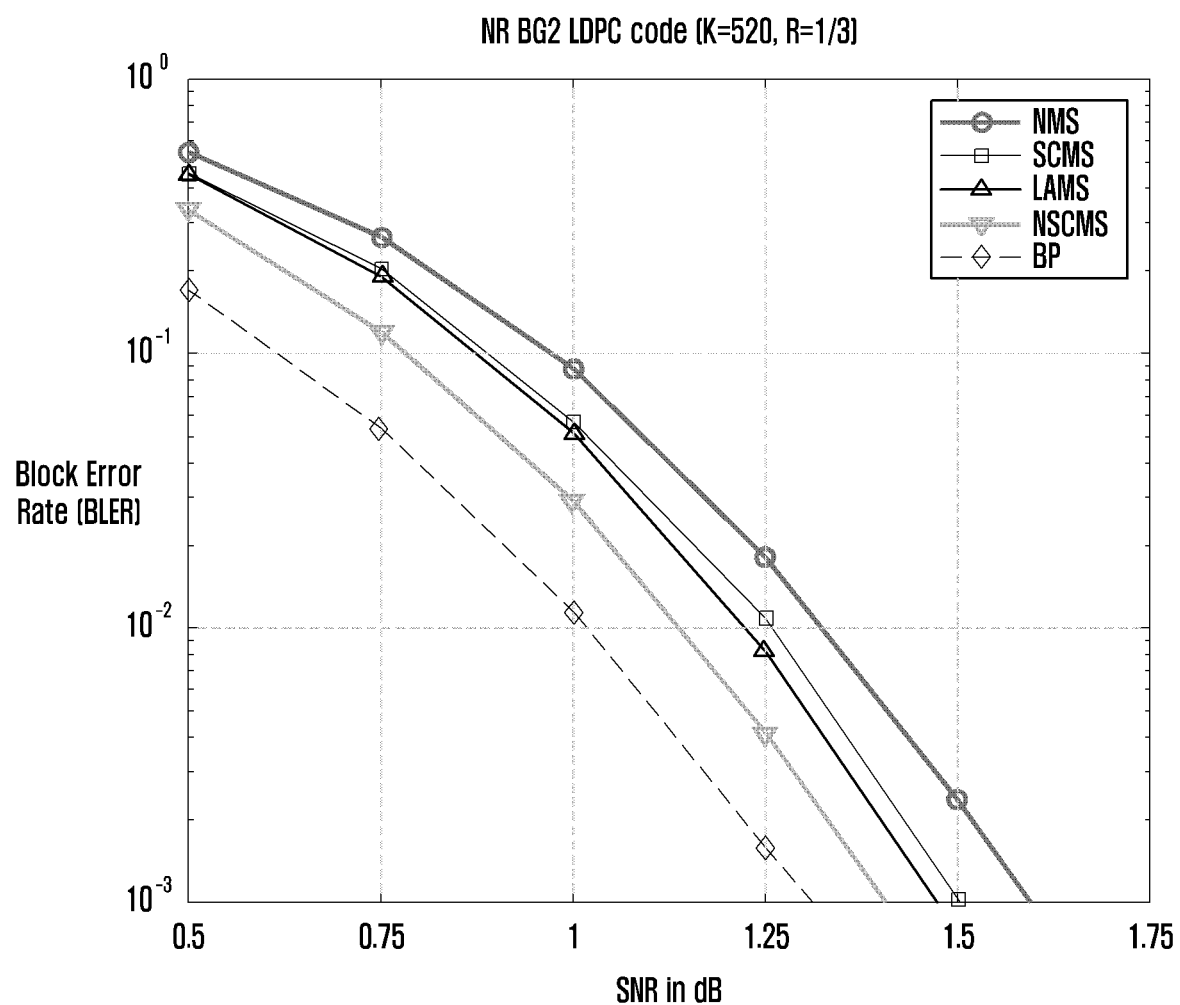
FIGS. 10A, 10B, 10C, and 10D illustrate a relationship between a signal-to-noise ratio (SNR) and a block error rate (BLER) of an electronic device according to various embodiments of the disclosure.
Figure 10B:
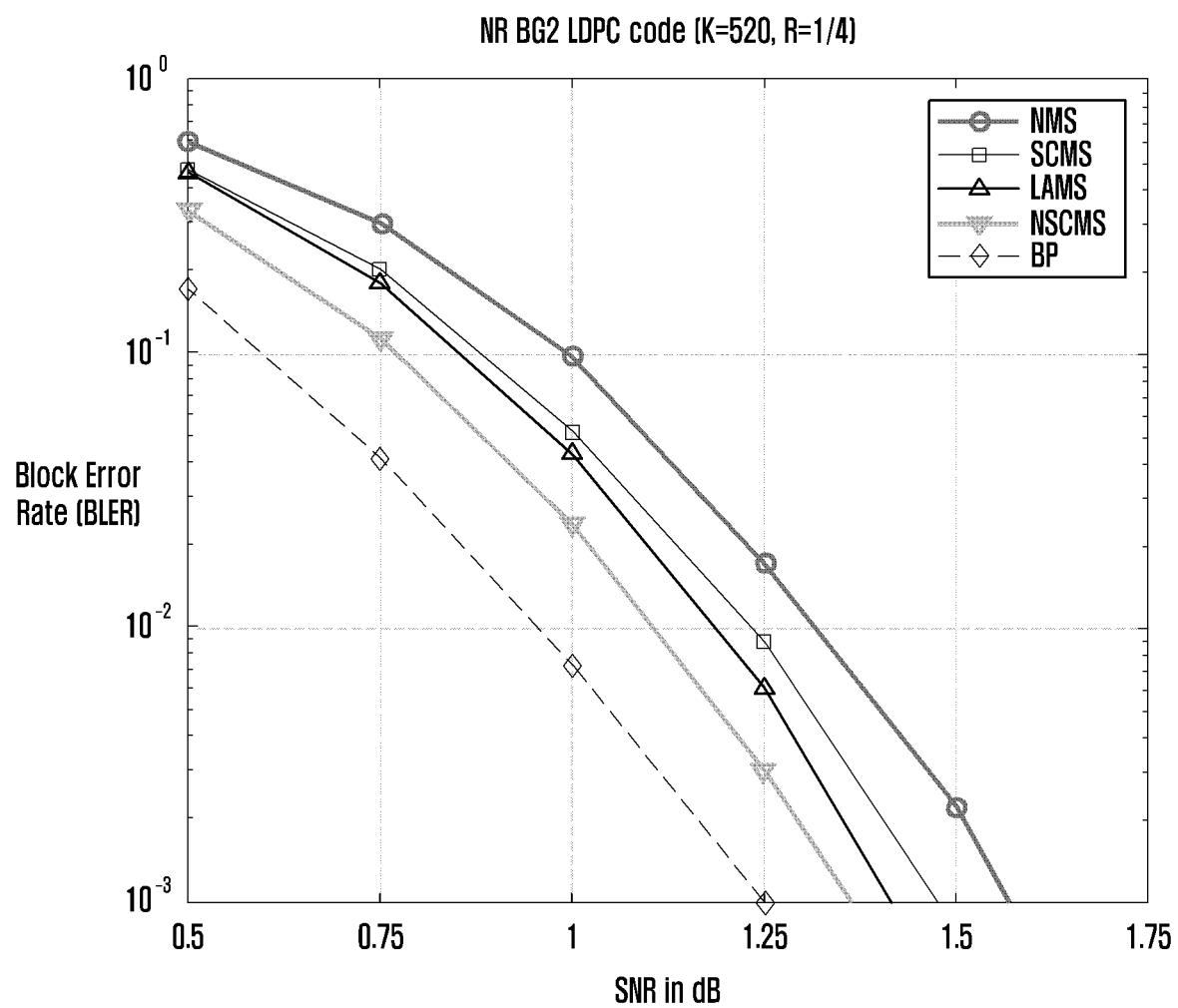
Figure 10C:
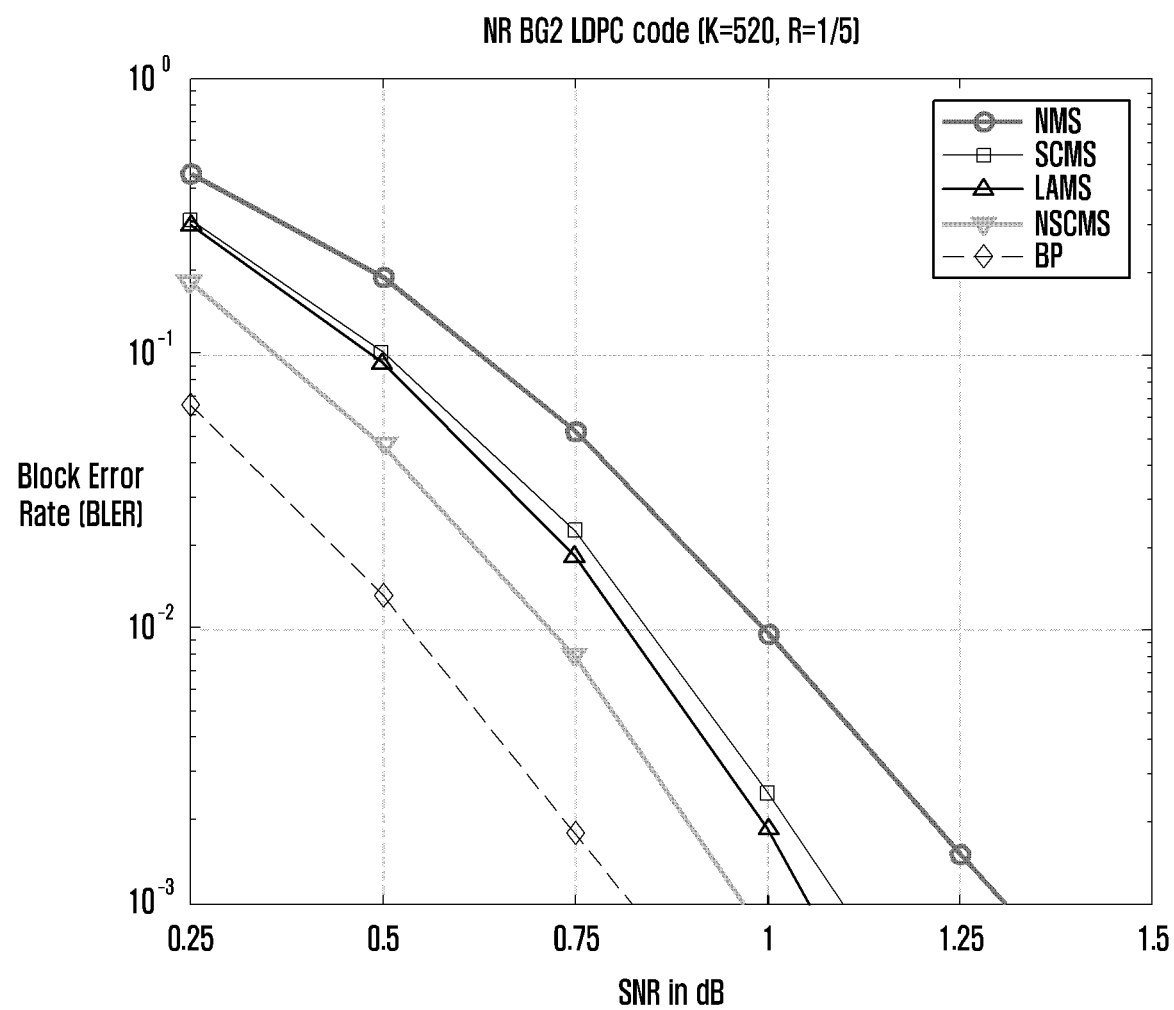
Figure 10D:
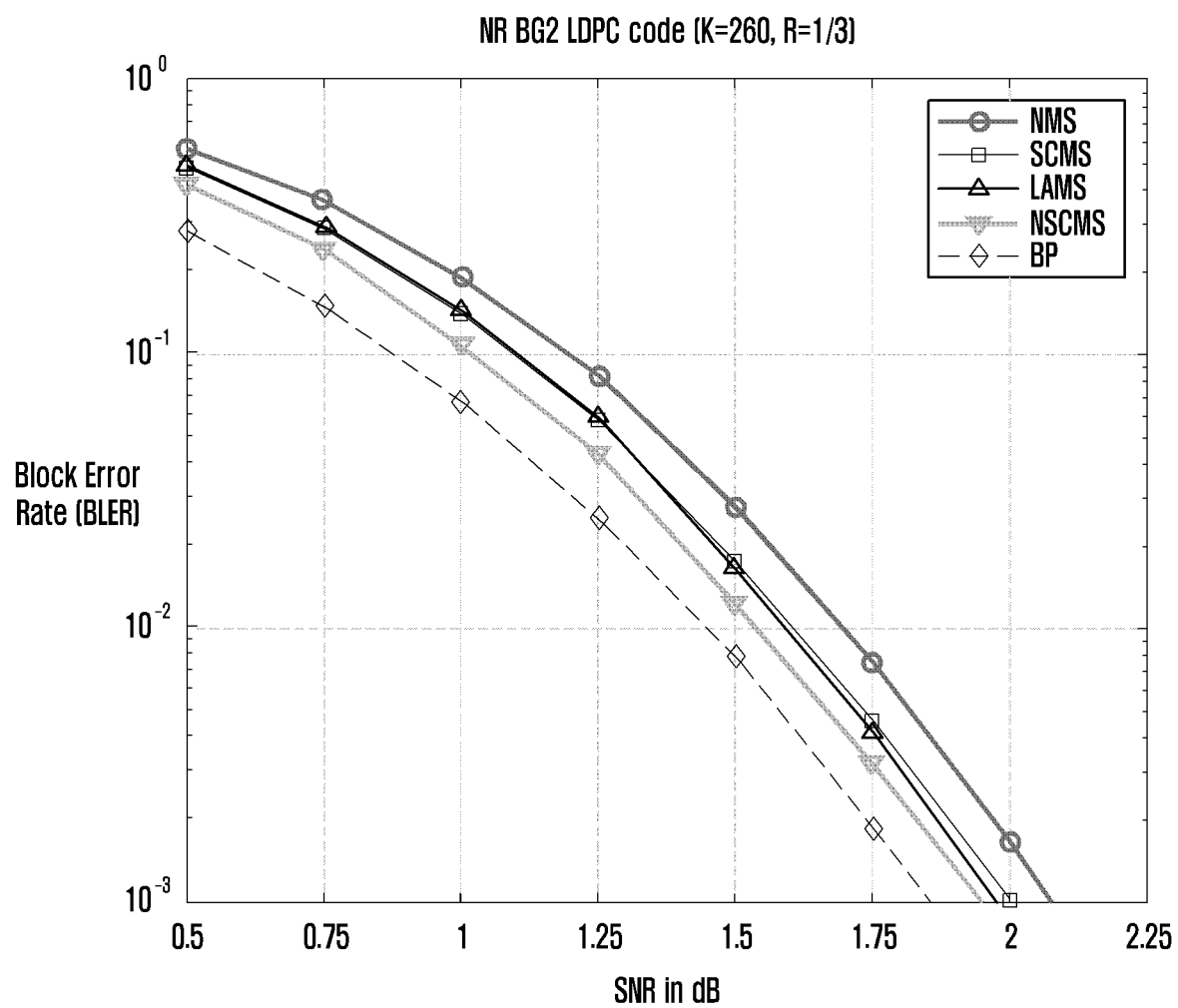
Figure 11A:
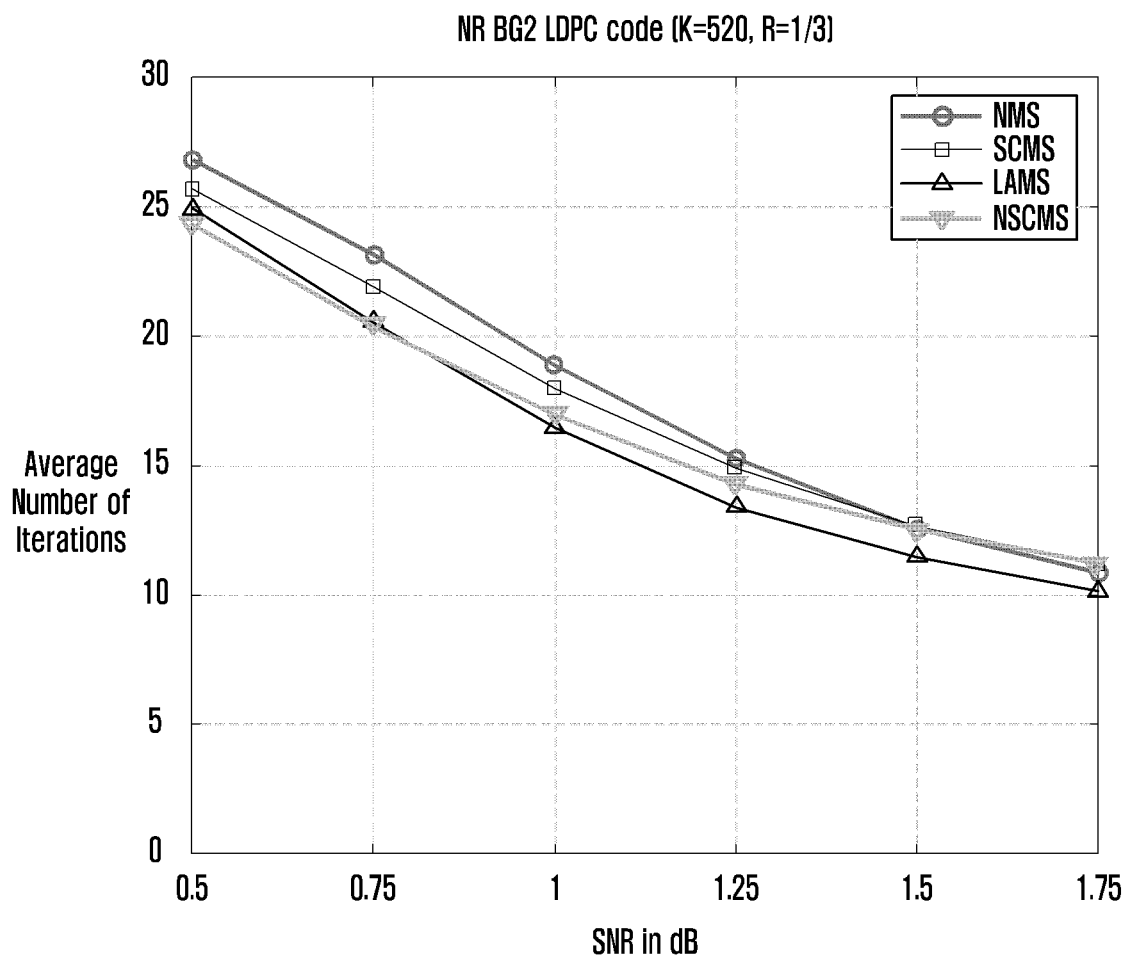
FIGS. 11A, 11B, 11C, and 11D illustrate a relationship between the number of iterations and an SNR in an electronic device according to various embodiments of the disclosure.
Figure 11B:
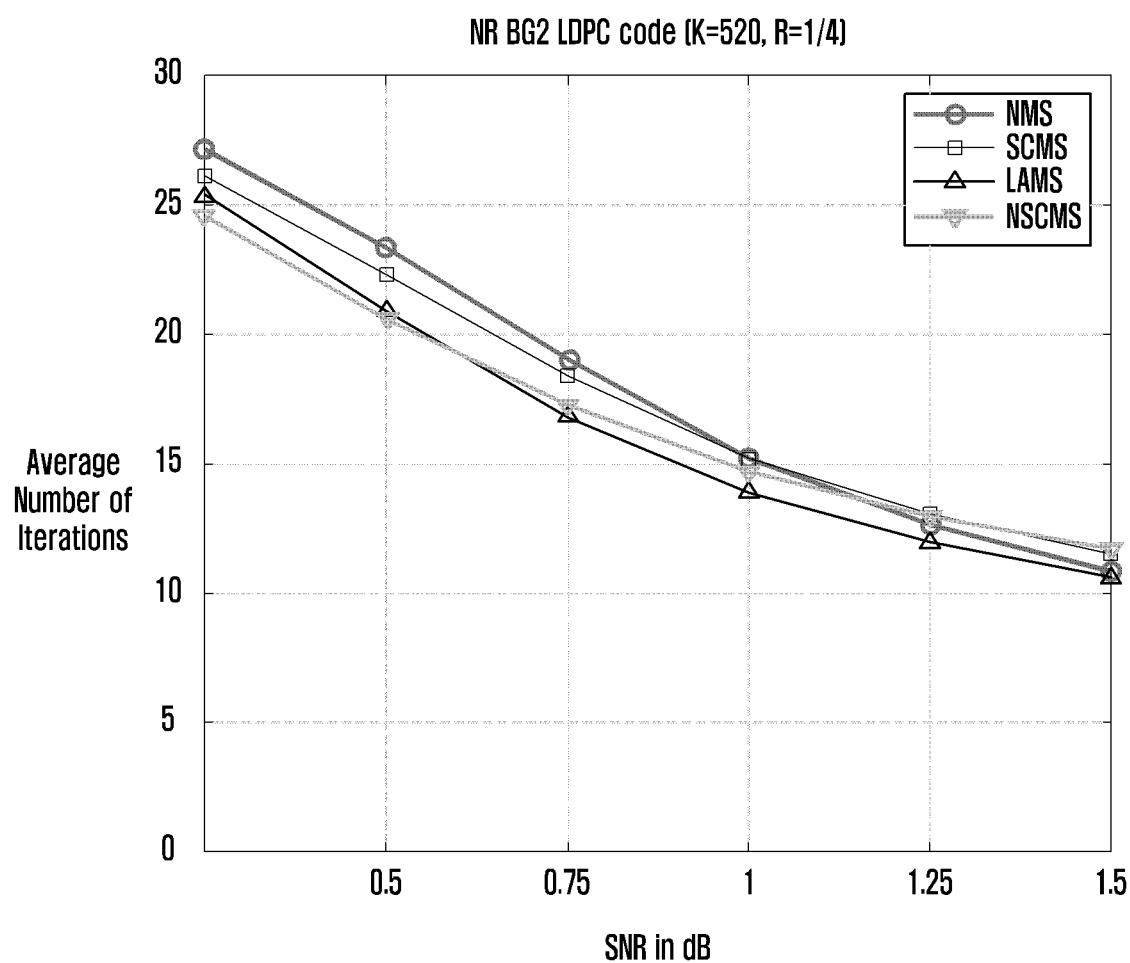
Figure 11C:
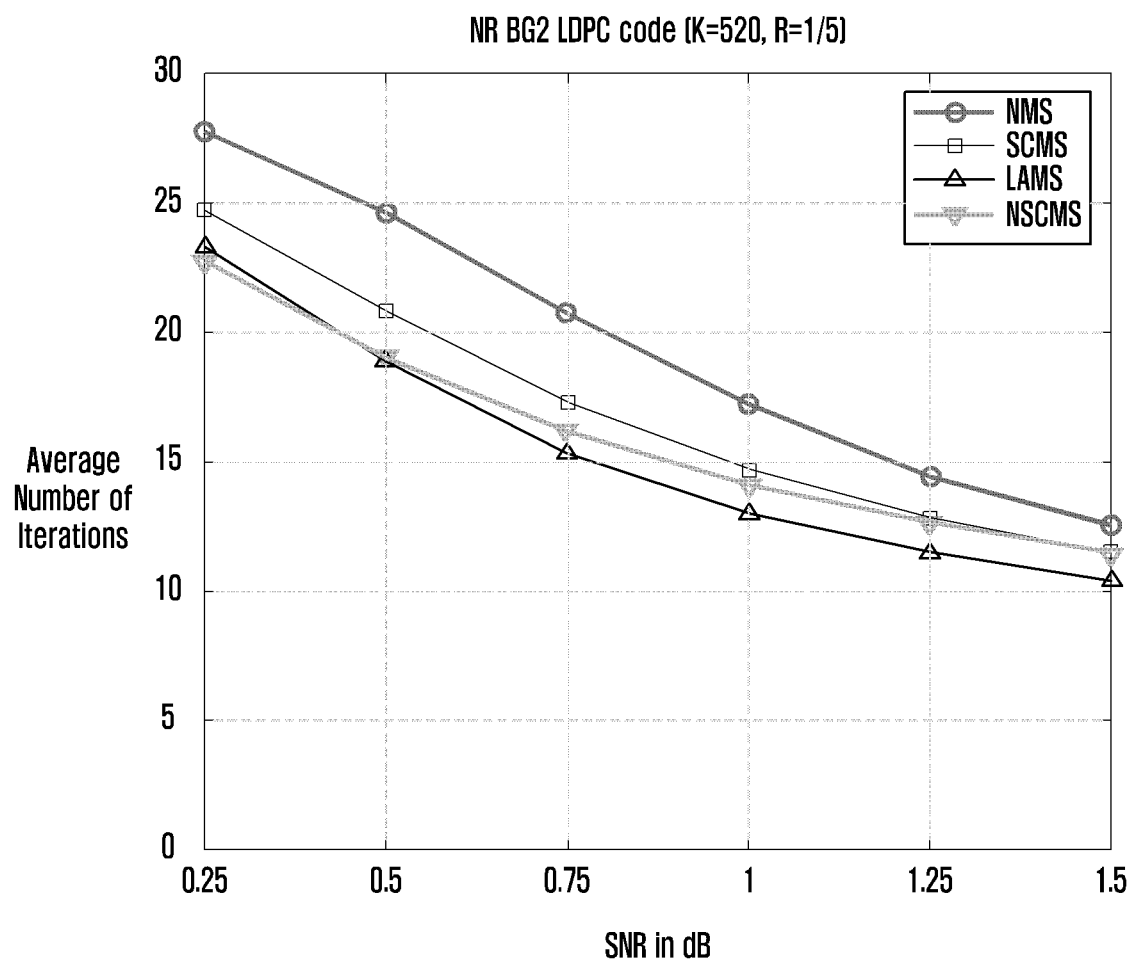
Figure 11D:
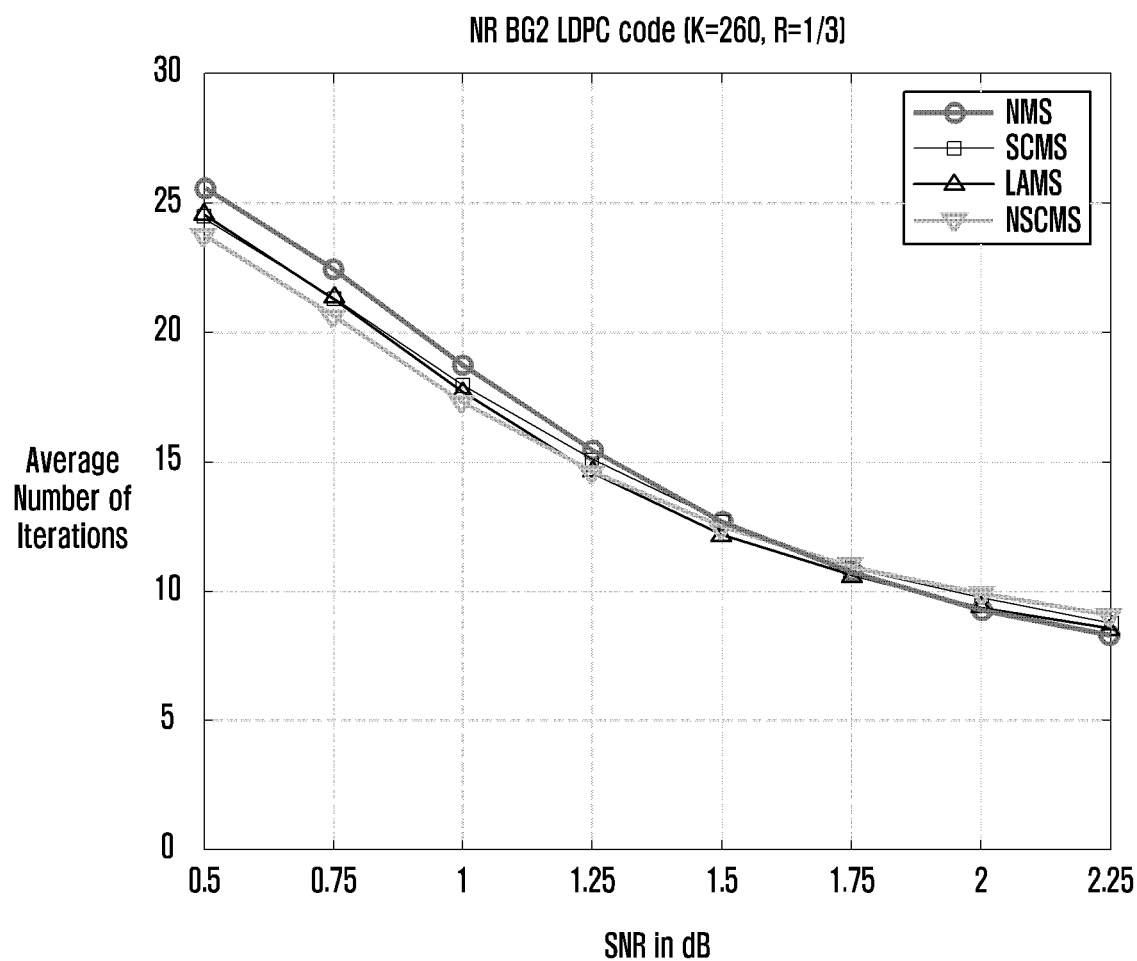

FIG. 9 shows that learning results of the disclosure converge to a lower loss than that in a conventional technique in which self-correction is not applied according to an embodiment of the disclosure.

FIGS. 10A to 10D show that the disclosure has a higher error correction capability than conventional techniques and the error correction capability is close to a belief propagation (BP) performance that is an optimal performance according to various embodiments of the disclosure.

FIGS. 11A to 11D show that the disclosure determines a proper codeword within a smaller or similar number of iterative decoding times than that in conventional techniques according to various embodiments of the disclosure.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A method for decoding a low-density parity-check (LDPC) code in a wireless communication system, the method comprising:
   receiving, by an electronic device, a signal, a codeword and information about an LPDC code used for encoding the codeword;
   configuring, by the electronic device, a neural network self-correction condition for adjusting a neural network node deletion and dropout rate;
   performing, by the electronic device, iterative decoding on the received signal and the codeword based on the information about the LPDC code used for encoding the codeword, wherein the iterative decoding uses decoding factors and a neural network self-correction technique;
   determining, by the electronic device, whether the iterative decoding of the received signal and the codeword succeeds or fails;
   storing, by the electronic device, the received signal and the codeword which are successfully decoded, based on a result of the determination; and
   updating, by the electronic device, the decoding factors, based on the stored received signal and the codeword,
   wherein the updating of the decoding factors comprises:
      reading the received signal and the codeword;
      erasing at least one node of the neural network through hysteresis-based neural network self-correction;
      learning a normalization factor, an offset factor, a channel normalization factor, and a channel offset factor of a corresponding iteration from a structure of the neural network having the read received signal as an input; and
      generating learning data for the neural network for optimizing a factor of a next iteration using the learned factors.

2. The method of claim 1, wherein the performing of the iterative decoding comprises:
   performing an operation for messages of a check node using a normalization factor and an offset factor;
   performing an operation for messages of a variable node using a channel normalization factor and a channel offset factor;
   determining the codeword, based on the messages of the variable node;
   performing an operation for a syndrome using the determined codeword and a parity check matrix;
   immediately terminating the decoding when the syndrome is a zero vector; and
   deleting information of some messages of the variable node through hysteresis-based self-correction.

3. The method of claim 2, wherein the deleting of the information of some messages of the variable node through the hysteresis-based self-correction comprises:
   determining whether to delete the information of the messages, based on a state difference between a message in a current iteration and a message in a previous iteration; or
   determining whether to delete the information of the messages, based on a state change in the message in the current iteration and messages in previous iterations.

4. The method of claim 1, wherein the determining whether the decoding of the codeword succeeds comprises identifying whether a cyclic redundancy check (CRC) is matched using the CRC.

5. The method of claim 1, wherein the erasing of the at least one node through the hysteresis-based neural network self-correction comprises:
   determining whether to erase a node, based on a state difference between a node value in the neural network and an input node value in a previous neural network; or
   determining whether to erase a node, based on a state change in the node value in the neural network and a node value in previous neural networks.

6. An electronic device for decoding a low-density parity-check (LDPC) code, the electronic device comprising:
   a processor; and
   a memory,
   wherein the processor is configured to:
      receive a signal, a codeword and information about an LPDC code used for encoding the codeword,
      configure a neural network self-correction condition for adjusting a neural network node deletion and dropout rate,
      perform iterative decoding on the received signal and the codeword based on the information about the LPDC code used for encoding the codeword, wherein the iterative decoding uses decoding factors and a neural network self-correction technique,
      determine whether the iterative decoding of the received signal and the codeword succeeds or fails,
      store, in the memory, the received signal and the codeword which are successfully decoded, based on a result of the determination, and
      update the decoding factors, based on the stored received signal and the codeword,
   wherein, to update the decoding factors, the processor is further configured to:
      read the received signal and the codeword,
      erase at least one node of the neural network through hysteresis-based neural network self-correction,
      learn a normalization factor, an offset factor, a channel normalization factor, and a channel offset factor of a corresponding iteration from a structure of the neural network having the read received signal as an input, and
      generate learning data for the neural network for optimizing a factor of a next iteration using the learned factors.

7. The electronic device of claim 6, wherein the processor is further configured to:
   perform an operation for messages of a check node using a normalization factor and an offset factor,
   perform an operation for messages of a variable node using a channel normalization factor and a channel offset factor,
   determine the codeword, based on the messages of the variable node,
   perform an operation for a syndrome using the determined codeword and a parity check matrix
   immediately terminate the decoding when the syndrome is a zero vector, and
   delete information of some messages of the variable node through hysteresis-based self-correction when the syndrome is not a zero vector.

8. The electronic device of claim 7, wherein, to delete the information of some messages of the variable node through the hysteresis-based self-correction, the processor is further configured to:
   determine whether to delete the information of the messages, based on a state difference between a message in a current iteration and a message in a previous iteration, or
   determine whether to delete the information of the messages, based on a state change in the message in the current iteration and messages in previous iterations.

9. The electronic device of claim 8, wherein a state of a message having a first direction in a particular iteration (i) is based on a log-likelihood ratio (LLR) for an nth bit of the codeword and an LLR for the nth bit of the codeword of another message in a second direction that is opposite the first direction.

10. The electronic device of claim 9,
    wherein the state of the message in the particular iteration (i) is a message from the variable node to the check node, and
    wherein the state of the message in the second direction is a message from the check node to the variable node.

11. The electronic device of claim 6, wherein, to determine whether the decoding of the codeword succeeds, the processor is further configured to identify whether a cyclic redundancy check (CRC) is matched using the CRC.

12. The electronic device of claim 7, wherein, to erase the at least one node through the hysteresis-based neural network self-correction, the processor is further configured to:
    determine whether to erase a node, based on a state difference between a node value in the neural network and an input node value in a previous neural network, or
    determine whether to erase a node, based on a state change in the node value in the neural network and a node value in previous neural networks.

* * * * *